US006485890B2

(12) United States Patent
Parsons et al.

(10) Patent No.: US 6,485,890 B2
(45) Date of Patent: Nov. 26, 2002

(54) LITHOGRAPHIC PRINTING FORMS

(75) Inventors: Gareth Rhodri Parsons, West Yorkshire (GB); David Stephen Riley, Leeds (GB); Richard David Hoare, West Yorkshire (GB); Alan Stanley Victor Monk, Cheshire (GB)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 09/860,943

(22) Filed: May 18, 2001

(65) Prior Publication Data

US 2002/0045124 A1 Apr. 18, 2002

Related U.S. Application Data

(62) Division of application No. 09/483,990, filed on Jan. 18, 2000, now Pat. No. 6,280,899, which is a division of application No. 08/981,620, filed as application No. PCT/GB97/01117 on Apr. 22, 1997, now abandoned.

(30) Foreign Application Priority Data

| | | |
|---|---|---|
| Apr. 23, 1996 | (GB) | 9608394 |
| Jul. 12, 1996 | (GB) | 9614693 |
| Aug. 13, 1996 | (WO) | PCT/GB96/01973 |
| Jan. 17, 1997 | (GB) | 9700884 |

(51) Int. Cl.[7] .................... G03F 7/039

(52) U.S. Cl. .................... 430/302; 430/270.1; 430/271.1; 430/273.1; 430/348; 430/435; 430/944; 430/945; 430/964

(58) Field of Search .................... 430/270.1, 271.1, 430/273.1, 278.1, 302, 944, 945, 348, 964, 435

(56) References Cited

U.S. PATENT DOCUMENTS

| | | | | |
|---|---|---|---|---|
| 2,766,118 A | 10/1956 | Sus et al. | 430/192 |
| 2,767,092 A | 10/1956 | Schmidt | 430/193 |
| 2,772,972 A | 12/1956 | Herrick, Jr. et al. | 96/33 |
| 2,859,112 A | 11/1958 | Sus et al. | 430/192 |
| 2,907,665 A | 10/1959 | Fraher | 106/49 |
| 3,046,110 A | 7/1962 | Schmidt | 430/193 |
| 3,046,111 A | 7/1962 | Schmidt | 430/193 |
| 3,046,115 A | 7/1962 | Schmidt et al. | 430/193 |
| 3,046,118 A | 7/1962 | Schmidt | 430/192 |
| 3,046,119 A | 7/1962 | Sus | 430/193 |
| 3,046,120 A | 7/1962 | Schmidt et al. | 430/192 |
| 3,046,121 A | 7/1962 | Schmidt | 96/33 |
| 3,046,122 A | 7/1962 | Sus | 96/33 |
| 3,046,123 A | 7/1962 | Sus et al. | 430/193 |
| 3,061,430 A | 10/1962 | Uhlig et al. | 430/193 |
| 3,102,809 A | 9/1963 | Endermann et al. | 430/193 |
| 3,105,465 A | 10/1963 | Peters | 122/37 |
| 3,628,953 A | 12/1971 | Brinkman | 430/270 |
| 3,635,709 A | 1/1972 | Kobayashi | 430/192 |
| 3,645,733 A | 2/1972 | Brinckman et al. | 430/325 |
| 3,647,443 A | 3/1972 | Rauner | 430/192 |
| 3,837,860 A | 9/1974 | Roos | |
| 3,859,099 A | 1/1975 | Petropoulos et al. | 430/191 |
| 3,891,439 A | 6/1975 | Katz et al. | 430/331 |
| 3,902,906 A | 9/1975 | Iwama et al. | 430/192 |
| 3,952,132 A | 4/1976 | Kato et al. | 428/341 |
| 4,063,949 A | 12/1977 | Uhlig et al. | 101/467 |
| 4,104,070 A | 8/1978 | Moritz et al. | 430/315 |
| 4,306,010 A | 12/1981 | Uehara et al. | 430/190 |
| 4,306,011 A | 12/1981 | Uehara et al. | 430/190 |
| 4,308,368 A | 12/1981 | Kubo et al. | 525/504 |
| 4,316,952 A | 2/1982 | Wendling et al. | 430/285 |
| 4,356,254 A | 10/1982 | Takashi et al. | 430/296 |
| 4,486,529 A | 12/1984 | Jeffers et al. | 430/300 |
| 4,493,884 A | 1/1985 | Nagano et al. | 430/192 |
| 4,497,888 A | 2/1985 | Nishioka et al. | 430/165 |
| 4,529,682 A | 7/1985 | Toukhy | 430/190 |
| 4,544,627 A | 10/1985 | Takashi et al. | 430/325 |
| 4,576,901 A | 3/1986 | Stahlhofen et al. | 430/325 |
| 4,609,615 A | 9/1986 | Yamashita | 430/325 |
| 4,684,599 A | 8/1987 | DoMinh et al. | 430/270 |
| 4,693,958 A | 9/1987 | Schwartz et al. | 430/302 |
| 4,708,925 A | 11/1987 | Newman | 430/270 |
| 4,743,528 A | 5/1988 | Farid et al. | 430/281 |
| 4,789,619 A | 12/1988 | Ruckert | 430/270.1 |

(List continued on next page.)

FOREIGN PATENT DOCUMENTS

| | | |
|---|---|---|
| DE | 4426820 | 7/1994 |
| EP | 0304313 | 2/1989 |
| EP | 0327998 | 8/1989 |
| EP | 0343986 | 11/1989 |

(List continued on next page.)

OTHER PUBLICATIONS

Ullmann's Encyclopedia of Inustrial Chemistry, vol. A 13, pp. 613–614, 625–626, 639–640, 658, VCH, 1989.

"Novolak phenol–aldehyde oligomers as components for photoresists," V. Dimitrov et al., *Acta Polymerica*, 42 (1991) pp. 285–289.

(List continued on next page.)

*Primary Examiner*—Janet Baxter
*Assistant Examiner*—Barbara Gilliam
(74) *Attorney, Agent, or Firm*—RatnerPrestia

(57) ABSTRACT

Thermally imageable lithographic printing plate precursors and heat-sensitive compositions for use in these printing plate precursors are disclosed. The compositions contain an aqueous developer soluble polymer, such as a phenolic resin; a compound that reduces the aqueous developer solubility of the polymer; and optionally, and infrared absorber. Examples of compounds that reduce the aqueous developer solubility of the polymer are those that contain at least one quarternized nitrogen atom, such as quinolinium compounds, benzothiazolium compounds, pyridinium compounds, and imidazoline compounds. On thermal imaging, the irradiated areas become more soluble in the aqueous developer and can be removed to form a positive image.

64 Claims, No Drawings

U.S. PATENT DOCUMENTS

| | | | | | |
|---|---|---|---|---|---|
| 4,927,741 | A | | 5/1990 | Garth et al. | 430/309 |
| 4,942,111 | A | | 7/1990 | Wade et al. | 430/273 |
| 4,966,798 | A | | 10/1990 | Brosius et al. | 428/64 |
| 4,973,572 | A | | 11/1990 | DeBoer | 503/227 |
| 4,997,745 | A | | 3/1991 | Kawamura et al. | 430/281 |
| 5,002,853 | A | | 3/1991 | Aoai et al. | 430/281.1 |
| 5,085,972 | A | | 2/1992 | Vogel | 430/270 |
| 5,130,223 | A | | 7/1992 | Nishimura et al. | 430/166 |
| 5,145,763 | A | | 9/1992 | Bassett et al. | 430/169 |
| 5,149,613 | A | | 9/1992 | Stahlhofen et al. | 430/296 |
| 5,166,041 | A | | 11/1992 | Murofushi et al. | 430/281 |
| 5,200,292 | A | | 4/1993 | Shinozaki et al. | 430/296 |
| 5,200,298 | A | | 4/1993 | Takagi et al. | 430/264 |
| 5,202,221 | A | | 4/1993 | Imai et al. | 430/283 |
| 5,208,135 | A | | 5/1993 | Patel et al. | 430/281 |
| 5,227,473 | A | | 7/1993 | Kawamura et al. | 534/557 |
| 5,268,245 | A | | 12/1993 | Chiulli | 430/7 |
| 5,279,918 | A | | 1/1994 | Nishi et al. | 430/190 |
| 5,286,612 | A | | 2/1994 | Tefler | 430/335 |
| 5,340,699 | A | | 8/1994 | Haley et al. | 430/302 |
| 5,351,617 | A | | 10/1994 | Williams et al. | 101/467 |
| 5,368,977 | A | | 11/1994 | Yoda et al. | 430/190 |
| 5,372,907 | A | | 12/1994 | Haley et al. | 430/157 |
| 5,372,915 | A | | 12/1994 | Haley et al. | 430/302 |
| 5,372,917 | A | | 12/1994 | Tsuchida et al. | 430/343 |
| 5,380,622 | A | | 1/1995 | Roser | 430/343 |
| 5,437,952 | A | | 8/1995 | Hirai et al. | 430/83 |
| 5,441,850 | A | | 8/1995 | Marshall et al. | 430/336 |
| 5,466,557 | A | | 11/1995 | Haley et al. | 430/278 |
| 5,491,046 | A | | 2/1996 | DeBoer et al. | 430/302 |
| 5,631,119 | A | | 5/1997 | Shinozaki | 430/326 |
| 5,641,608 | A | | 6/1997 | Grunwald et al. | 430/302 |
| 5,658,708 | A | | 8/1997 | Kondo | 430/288.1 |
| 5,705,308 | A | | 1/1998 | West et al. | 430/165 |
| 5,705,309 | A | | 1/1998 | West et al. | 430/944 |
| 5,705,322 | A | | 1/1998 | West et al. | 430/944 |
| 5,725,994 | A | | 3/1998 | Kondo | 430/302 |
| 5,731,123 | A | | 3/1998 | Kawamura | 430/176 |
| 5,741,619 | A | | 4/1998 | Aoshima et al. | 430/302 |
| 5,759,742 | A | | 6/1998 | West et al. | 430/302 |
| 5,786,125 | A | | 7/1998 | Tsuchiya et al. | 430/272.1 |
| 5,814,431 | A | | 9/1998 | Nagasaka et al. | 430/281.1 |
| 5,824,451 | A | | 10/1998 | Aoai et al. | 430/270.1 |
| 5,840,467 | A | | 11/1998 | Kitatani et al. | 430/165 |
| 5,858,626 | A | | 1/1999 | Sheriff et al. | 430/326 |
| 6,060,217 | A | | 5/2000 | Nguyen et al. | 430/302 |
| 6,060,218 | A | | 5/2000 | VanDamme et al. | 430/302 |
| 6,060,222 | A | | 5/2000 | West et al. | 430/326 |
| 6,074,802 | A | | 6/2000 | Murata et al. | 430/270.1 |
| 6,083,662 | A | | 7/2000 | Miller et al. | 430/302 |
| 6,090,532 | A | | 7/2000 | West et al. | 430/326 |
| 6,117,610 | A | | 9/2000 | Sheriff et al. | 430/190 |
| 6,130,026 | A | | 10/2000 | Bennett et al. | 430/303 |
| 6,187,511 | B1 | | 2/2001 | Bennett et al. | 430/303 |
| 6,200,727 | B1 | * | 3/2001 | Urano et al. | 430/270.1 |
| 6,251,559 | B1 | * | 6/2001 | Huang et al. | 430/270.1 |
| 6,294,311 | B1 | * | 9/2001 | Shimazu et al. | 430/271.1 |
| 6,300,038 | B1 | * | 10/2001 | Shimazu et al. | 430/270.1 |

FOREIGN PATENT DOCUMENTS

| | | |
|---|---|---|
| EP | 0366590 | 5/1990 |
| EP | 0375838 | 7/1990 |
| EP | 0390038 | 1/1991 |
| EP | 0410606 | 1/1991 |
| EP | 0424182 | 4/1991 |
| EP | 0458485 | 11/1991 |
| EP | 0517428 | 12/1992 |
| EP | 0519128 | 12/1992 |
| EP | 0519591 | 12/1992 |
| EP | 0534324 | 3/1993 |
| EP | 0557138 | 8/1993 |
| EP | 0608983 | 8/1994 |
| EP | 0631189 | 12/1994 |
| EP | 0652483 | 5/1995 |
| EP | 0 672 954 A2 | 9/1995 |
| EP | 0672954 | 9/1995 |
| EP | 0691575 | 1/1996 |
| EP | 0706899 | 4/1996 |
| EP | 0720057 | 7/1996 |
| EP | 0750230 | 12/1996 |
| EP | 0780239 | 6/1997 |
| EP | 0784233 | 7/1997 |
| EP | 0803771 | 10/1997 |
| EP | 0819980 | 1/1998 |
| EP | 0823327 | 2/1998 |
| EP | 0839647 | 5/1998 |
| EP | 0864419 | 9/1998 |
| EP | 0867278 | 9/1998 |
| EP | 0 855 267 A3 | 2/1999 |
| EP | 0894622 | 2/1999 |
| EP | 0 908 306 A2 | 4/1999 |
| GB | 1155035 | 6/1969 |
| GB | 1170495 | 11/1969 |
| GB | 1231789 | 5/1971 |
| GB | 1245924 | 9/1971 |
| GB | 1546633 | 5/1979 |
| GB | 1563829 | 4/1980 |
| GB | 1603920 | 12/1981 |
| GB | 2082339 | 3/1982 |
| JP | 48090082 | 11/1973 |
| JP | 52012825 | 1/1977 |
| JP | 52146216 | 5/1977 |
| JP | 52146220 | 5/1977 |
| JP | 55048749 | 4/1980 |
| JP | 56-069192 | 6/1981 |
| JP | 58148792 | 9/1983 |
| JP | 58162389 | 9/1983 |
| JP | 61036750 | 2/1986 |
| JP | 62024241 | 2/1987 |
| JP | 63179348 | 7/1988 |
| JP | 63253933 | 10/1988 |
| JP | 1-108543 | 4/1989 |
| JP | 02010355 | 1/1990 |
| JP | 02287545 | 11/1990 |
| JP | 04357086 | 12/1992 |
| JP | 06095388 | 4/1994 |
| JP | 07043854 | 2/1995 |
| JP | 07120928 | 5/1995 |
| JP | 07281435 | 10/1995 |
| JP | 07287393 | 10/1995 |
| JP | 9-43847 | 2/1997 |
| JP | 09171254 | 6/1997 |
| WO | 8602743 | 5/1986 |
| WO | 9119227 | 12/1991 |
| WO | 9306528 | 4/1993 |
| WO | 9602491 | 2/1996 |
| WO | 9620429 | 7/1996 |

OTHER PUBLICATIONS

"The Technology Generations of Digital Thermal Printing Plates," R. Goodman et al., TAGA 1999.

"Computer–to–Plate: Automating the Printing Industry," R.M. Adams & R.J. Romano, pp. 85, 144, 147 (1996).

"Unconventional Printing Plate Exposed by IR (830 mm) Laser Diodes," J.E. Walls, TAGA Proceedings, pp. 259–267 (1994).

"Photoreactive Polymers," A. Reiser, pp. 283, 293 (1989).

"Photogeneration of Acid: Part 6—A Review of Basic Principles fro Resist Imaging Applications," S.P. Pappas, *J. Imaging Techn.*, 11, pp. 146–157 (1985).
"Cationic Polymerization—Iodonium and Sulfonium Salt Photoinitiators," J.V. Crivello, *Advances in Polymer Science*, 62, pp. 1–48, (1984).
"Imaging Systems," p. 135, (1976).
Absorption Spectra of "Dye B".
"Printing Materials: Science and Technology," Emission spectra for different flourescent lamps, B. Thompson, p. 35 (1998).
"The Chemical Behavior of Positive Working Systems," J.C. Strieter, Proc of Microelectronics Seminar: Interface 76, pp. 116–122, Eastman Kodak, (1976).
N. Kihara, et al., Proc. SPIE, 2724, 208–211 (1996).
Chemistry and Technology of UV and EB Formulations for Coatings, Inks & Paints, vol. III, K. Dietliker, pp. 381–2 (1991).
Ullmann's Encyclopedia of Industrial Chemistry, $5^{th}$ Ed., vol. A13, p. 613 (1989).
V.H. Steppan, et al., Angew. Chem., Int. Ed. Engl., 21, 455–469 (1982).
H Baumann, et al. Journal für praktische Chemie, 336, 380 (1994).
Hsiao–Yi Shih, et al., Macromolecules, 28, 5595–5600 (1995).
Hsiao–Yi Shih, et al., Macromolecules, 29, 2082–2087 (1996).
Hsiao–Yi et al., Macromolecules, 27, 3330–3336 (1994).
M.J. O'Brien, Polymer Engineering and Science, 29, 846–849 (1989).
N. Kihara, et al., J. Electrochem. Soc. 141, 3162–3166 (1994).
M.J. Boden, et al., J. Electrochem. Soc. 126, 1304–1312 (1981).
English Translation of Japanese Official Action for Japanese Patent Application 537850/1997.
Photoreactive Polymers, A Reiser, Wiley Interscience, pp. 218–219 (1989).
T–F Yeh, et al., Journal of Photopolymer Science and Technology, 7, 229–240, (1994).
C.L. McAdams, et al., Polymeric Mater. Sci. Eng., 77, 437 (1997).
English translation of M. Rudzinskaya, et al., Poligrafiya, 2, 24 (1977).
Abstract of C.L. McAdams, Masters Thesis, Univ. of Texas at Austin (1996).
"Structure–Function Correlation Studies of Dissolution Inhibitors for Novolac–Based Photoresists," Christopher L. McAdams, Masters Thesis, University of Texas at Austin, submitted Jul. 25, 1996; revised Mar. 15, 1999.

* cited by examiner

LITHOGRAPHIC PRINTING FORMS

CROSS-REFERENCE TO RELATED APPLICATION

This application is a divisional application of U.S. Pat. application Ser. No. 09/483,990, filed Jan. 18, 2000, now U.S. Pat. No. 6,280,899 B1, issued Aug. 28, 2001, which is a divisional application of U.S. Pat. application Ser. No. 08/981,620, now abandoned, filed Dec. 22, 1997, which is a 371 of PCT/GB97/01117, filed Apr. 22, 1997, both of which are incorporated herein by reference.

FIELD OF THE INVENTION

This invention relates to positive working lithographic printing form precursors, to their use, and to imagable compositions for use thereon.

BACKGROUND OF THE INVENTION

The art of lithographic printing is based on the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water while the image area accepts ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is reproduced.

A generally used type of lithographic printing form precursor has a light sensitive coating applied to an aluminium base support. Negative working lithographic printing form precursors have a radiation sensitive coating which when imagewise exposed to light hardens in the exposed areas. On development the non-exposed areas of the coated composition are removed leaving the image. On the other hand positive working lithographic printing form precursors have a coated composition, which after imagewise exposure to light of an appropriate wavelength, becomes more soluble in the exposed areas than in the non-exposed areas in a developer. This light induced solubility differential is called photosolubilisation. A large number of commercially available positive working printing form precursors coated with quinone diazides together with a phenolic resin work by photosolubilisation to produce an image. In both cases the image area on the printing form itself is ink-receptive or oleophilic and the non-image area or background is water receptive or hydrophilic.

The differentiation between image and non-image areas is made in the exposure process where a film is applied to the printing form precursor with a vacuum to ensure good contact. The printing form precursor is then exposed to a light source, a portion of which is composed of UV radiation. In the instance where a positive printing form precursor is used, the area of the film that corresponds to the image on the printing form precursor is opaque so that no light will strike the printing form precursor, whereas the area on the film that corresponds to the non-image area is clear and permits the transmission of light to the coating which becomes more soluble and is removed.

More recent developments in the field of lithographic printing form precursors have provided radiation-sensitive compositions useful for the preparation of direct laser addressable printing form precursors. Digital imaging information can be used to image the printing form precursor without the need to utilise an imaging master such as a photographic transparency.

An example of a positive working, direct laser addressable printing form precursor is described in U.S. Pat. No. 4,708,925, issued Nov. 24, 1987. This patent describes a lithographic printing form precursor in which the imaging layer comprises a phenolic resin and a radiation-sensitive onium salt. As described in the patent, the interaction of the phenolic resin and the onium salt produces an alkali-insoluble composition which is restored to alkali solubility upon photolytic decomposition of the onium salt. The printing form precursor can be utilised as a positive working printing form precursor or as a negative working printing form precursor using additional process steps between exposure and development as detailed in British Patent no. 2,082,339. The printing form precursors described in U.S. Pat. No. 4,708,925 are intrinsically sensitive to UV radiation and can be additionally sensitised to visible and infra-red radiation.

A further example of a laser addressable printing form precursor which can be utilised as a direct positive working system is described in U.S. Pat. No. 5,372,907, issued Dec. 13, 1994, and U.S. Pat. No. 5,491,046, issued Feb. 13, 1996. These two patents describe a radiation induced decomposition of a latent Bronsted acid to increase the solubility of the resin matrix on imagewise exposure. As with the printing form precursor described in U.S. Pat. No. 4,708,925 these systems can be additionally utilised as a negative working system with additional process steps after imaging and pre-development. In the negative working process the decomposition by-products are subsequently used to catalyse a cross-linking reaction between resins to insolubilise the imaged areas prior to development. As in U.S. Pat. No. 4,708,925 these printing form precursors are intrinsically sensitive to UV radiation due to the acid generator materials used.

The hereinabove described printing form precursors of the prior art which can be employed as direct imaged positive working printing form precursors are lacking in one or more desirable features. None of the printing form precursors described can be handled extensively without due consideration for the lighting conditions in the working area. In order to handle the printing form precursors for unlimited periods special safelighting conditions are required which prevent unwanted exposure to UV radiation. The printing form precursors may be utilised for limited periods only in white light working conditions dependent on the output spectrum of the white light source. It would be desirable to utilise digital imaging hardware and printing form precursors in the unrestricted, white light press room environment in order to streamline workflows and UV sensitivity would be a disadvantage in these areas. In addition, white light handling would provide an improved working environment in traditional pre-press areas which currently have to be under restrictive safelight conditions.

Moreover, both printing form precursor systems have constraints on their components which create difficulties in optimising plate properties to provide optimum performance across the wide range of demanding lithographic plate performance parameters, including developer solubility, ink receptivity, runlength, adhesion.

In the systems described in U.S. Pat. No. 4,708,925 the presence of functional groups which would crosslink the phenolic resin in the presence of the onium salts upon irradiation cannot be allowed, either as a modification to the alkali soluble resin or as additional components in the composition, as this would lead to reduced solubilisation on exposure.

An essential requirement of the compositions described in U.S. Pat. No. 5,491,046 is the presence of both a resole resin and a novolak resin in order to allow the use of the system in a negative working mode. This is the favoured mode for this system as demonstrated by the negative working patent examples and the first commercialised product derived from this proprietary technology, Kodak's Performer product. This optimisation for negative working potential restricts optimisation for the positive working mode which does not have this requirement.

A wide range of heat solubilising compositions useful as thermographic recording materials have previously been disclosed in GB 1,245,924, issued Sep. 15, 1971, such that the solubility of any given area of the imagable layer in a given solvent can be increased by the heating of the layer by indirect exposure to a short duration high intensity visible light and/or infrared radiation transmitted or reflected from the background areas of a graphic original located in contact with the recording material. The systems described are varied and operate by many different mechanisms and use different developing materials ranging from water to chlorinated organic solvents. Included in the range of compositions disclosed which are aqueous developable are those which comprise a novolak type phenolic resin. The patent suggests that coated films comprising of such resins will show increased solubility on heating. The compositions may contain heat absorbing compounds such as carbon black or Milori Blue (C.I. Pigment Blue 27). These materials additionally colour the images for their use as a recording medium.

The level of solubility differential in the compositions described in GB 1,245,924, however, is very low compared to that of commercial positive working lithographic printing form precursor compositions. Standard lithographic printing form precursors are able to demonstrate excellent tolerance to strong developing solutions, good robustness to variations in customer use and can be optimised to provide high developer solution usage and high numbers of printed impressions. The very poor developer latitude exhibited by the compositions of GB 1,245,924 makes them unsuitable for commercially acceptable lithographic printing form precursors.

SUMMARY OF THE INVENTION

We have discovered a heat-sensitive composition suitable for application as a heat-sensitive positive working printing form precursor for heat mode imaging which does not exhibit the disadvantages of the prior art as described hereinabove.

The composition of the present invention is heat-sensitive in that localised heating of the composition, preferably by suitable radiation, causes an increase in the aqueous developer solubility of the exposed areas.

Therefore according to one aspect of the present invention there is provided an oleophilic, heat-sensitive composition comprising an aqueous developer soluble polymeric substance, hereinafter called the "active polymer", and a compound which reduces the aqueous developer solubility of the polymeric substance, hereinafter called the "reversible insolubiliser compound", characterised in that the aqueous developer solubility of the composition is increased on heating and that the aqueous developer solubility of the composition is not increased by incident UV radiation.

According to a further aspect of the present invention there is provided a positive working lithographic printing form precursor having a coating comprising of a composition comprising a said active polymer and a said reversible insolubiliser compound coated on a support having a hydrophilic surface characterised in that the aqueous developer solubility of the composition is increased on heating and that the aqueous developer solubility of the composition is not increased by incident UV radiation.

In order to increase the sensitivity of the heat-sensitive compositions of the present invention it is beneficial to include an additional component, namely a radiation absorbing compound capable of absorbing incident radiation and converting it to heat, hereinafter called a "radiation absorbing compound".

Therefore a further aspect of the present invention is a lithographic printing form precursor wherein said coating is suitably adapted to preferentially absorb radiation and convert said radiation to heat.

Therefore according to a preferred embodiment of the present invention there is provided a heat-sensitive positive working lithographic printing form precursor which has on a support having a hydrophilic surface an oleophilic, heat-sensitive composition comprising a said active polymer, a said reversible insolubiliser compound and a said radiation absorbing compound, characterised in that the aqueous developer solubility of the composition is increased on heating and that the aqueous developer solubility of the composition is not increased by incident UV radiation.

In a further preferred embodiment of the present invention there is provided a heat-sensitive positive working lithographic printing form precursor wherein the said coating includes an additional layer disposed beneath the oleophilic, heat-sensitive composition, wherein the additional layer comprises a radiation absorbing compound.

In a further preferred embodiment of the present invention there is provided a heat-sensitive positive working lithographic printing form precursor which has on a support having a hydrophilic surface an oleophilic, heat-sensitive composition comprising a said active polymer and a said reversible insolubiliser compound which is also a said radiation absorbing compound characterised in that the aqueous developer solubility of the composition is increased on heating and that the aqueous developer solubility of the composition is not increased by incident UV radiation.

DETAILED DESCRIPTION OF THE INVENTION

In the specification, when we state that the aqueous developer solubility of the composition is increased on heating we mean that it is substantially increased, i.e. by an amount useful in a lithographic printing process. When we state that the aqueous developer solubility of the composition is not increased by incident UV radiation we mean that it is not substantially increased, that is by an amount which would mean that UV safelighting conditions would have to be employed. Thus, insubstantial increases in solubility on UV radiation may be tolerated within the scope of this invention.

The printing form is preferably a lithographic plate and will be referred to as such hereinafter.

Thus in all preferred embodiments of the present invention a positive working lithographic printing plate is obtained after heat-mode imaging and processing. The aqueous developer solubility of the coated composition is much reduced with respect to the solubility of the active polymer alone. On subsequent exposure to suitable radiation the heated areas of the composition are rendered more soluble in the developing solution. Therefore on imagewise exposure there is a change in the solubility differential of the unexposed composition and of the exposed composition. Thus in the exposed areas the composition is dissolved revealing the underlying hydrophilic surface of the plate.

The coated plates of the invention may be heat imaged indirectly by exposure to a short duration of high intensity radiation transmitted or reflected from the background areas of a graphic original located in contact with the recording material.

In another aspect of the invention preferably the plates may be imagewise heated using a heated body. For example, the plates, either the reverse face or, preferably, the heat sensitive composition, may be contacted by heat stylus.

In another aspect of the invention preferably the plate is exposed directly by means of a laser to heat the coating imagewise. Most preferably the laser emits radiation at above 600 nm.

Whilst the applicants do not wish to be limited by any theoretical explanation of how their invention operates, it is believed that a thermally frangible complex is formed between the active polymer and the reversible insolubiliser compound. This complex is believed to be reversibly formed and can be broken by application of heat to the complex to restore aqueous developer solubility to the composition. It is thought that polymeric substances suitable for use in the current invention comprise electron rich functional groups when uncomplexed and that suitable compounds which reduce the aqueous developer solubility of the polymeric substance are electron poor. It is not thought that decomposition of components within the composition is required, or that any substantial decomposition has occurred in any examples tested to date.

Examples of functional groups of said active polymers suitable for application in this invention include hydroxy, carboxylic acid, amino, amide and maleiimide functional groups. A wide range of polymeric materials are suitable for use in the present invention examples of which include phenolic resins; copolymers of 4-hydroxystyrene, for example with 3-methyl-4-hydroxystyrene or 4-methoxystyrene; copolymers of (meth)acrylic acid, for example with styrene; copolymers of maleiimide, for example with styrene; hydroxy or carboxy functionalised celluloses; copolymers of maleic anhydride, for example with styrene; partially hydrolysed polymers of maleic anhydride.

Most preferably the active polymer is a phenolic resin. Particularly useful phenolic resins in this invention are the condensation products from the interaction between phenol, C-alkyl substituted phenols (such as cresols and p-tert-butylphenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Examples of suitable novolak resins have the following general structure.

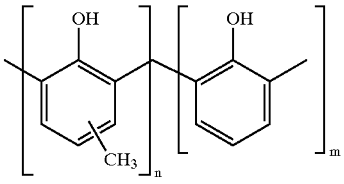

A large number of compounds which reduce the aqueous solubility of suitable polymeric substances have been located for use as reversible insolubiliser compounds.

A useful class of reversible insolubiliser compounds are nitrogen containing compounds wherein a least one nitrogen atom is either quarternised, incorporated in a heterocyclic ring or quarternised and incorporated in a heterocyclic ring.

Examples of useful quaternised nitrogen containing compounds are triaryl methane dyes such as Crystal Violet (CI basic violet 3) and Ethyl Violet and tetraalkyl ammonium compounds such as Cetrimide.

More preferably the reversible insolubiliser compound is a nitrogen-containing heterocyclic compound.

Examples of suitable nitrogen-containing heterocyclic compounds are quinoline and triazols, such as 1,2,4-triazol.

Most preferably the reversible insolubiliser compound is a quarternised heterocyclic compound.

Examples of suitable quarternised heterocyclic compounds are imidazoline compounds, such as Monazoline C, Monazoline 0, Monazoline CY and Monazoline T all of which are manufactured by Mona Industries, quinolinium compounds, such 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Dye A, Quinoldine Blue and 3-ethyl-2-[3-(3-ethyl-2(3H)-benzothiazolylidene)-2-methyl-1-propenyl]benzothiazolium iodide.

Dye A

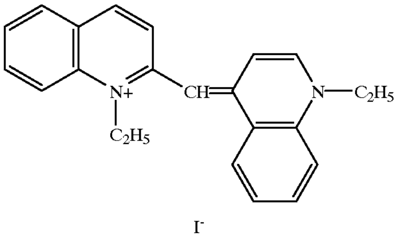

A further useful class of reversible insolubiliser compounds are carbonyl functional group containing compounds.

Examples of suitable carbonyl containing compounds are α-naphthoflavone, β-naphthoflavone, 2,3-diphenyl-1-indeneone, flavone, flavanone, xanthone, benzophenone, N-(4-bromobutyl)phthalimide and phenanthrenequinone.

The reversibly insolubilising compound may be a compound of general formula $$Q_1\text{-S(O)}_n\text{-}Q_2$$

Where $Q_1$ represents an optionally substituted phenyl or alkyl group, n represents 0, 1 or 2, and $Q_2$ represents a halogen atom or an alkoxy group. Preferably $Q_1$ represents a $C_{1-4}$ alkyl phenyl group, for example a tolyl group, or a $C_{1-4}$ alkyl group. Preferably n represents 1 or, especially, 2. Preferably $Q_2$ represents a chlorine atom or a $C_{1-4}$ alkoxy group, especially an ethoxy group.

Another useful reversible insolubiliser compound is acridine orange base (CI solvent orange 15).

Other useful reversible insolubiliser compounds are ferrocenium compounds, such as ferrocenium hexafluorophosphate.

In addition to the active polymer which interacts with the reversible insolubiliser compound in the manner defined herein the composition may contain a polymeric substance which does not thus interact. In such a composition having a blend of polymeric substances it should be noted that the active polymer can be present in a lower amount, by weight, than the additional polymeric substance(s). Suitably the active polymer is present in an amount of at least 10%, preferably at least 25%, more preferably at least 50%, by total weight of the polymer substances present in the composition. Most preferably, however, the active polymer is present to the exclusion of any polymeric substance which does not thus interact.

The major proportion of the composition is preferably constituted by polymeric substance(s), including the active polymer and, when present, an additional polymeric substance which does not thus interact. Preferably a minor proportion of the composition is constituted by the reversible insolubiliser compound.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

Suitably the reversible insolubiliser compound constitutes at least 1%, preferably at least 2%, preferably up to 25%, more preferably up to 15% of the total weight of the composition.

Thus a preferred weight range for the reversible insolubiliser compound may be expressed as 2–15% of the total weight of the composition.

There may be more than one polymeric substance which interacts with the said compound. References herein to the proportion of such substance(s) are to their total content. Likewise there may be more than one polymeric substance which does not thus interact. References herein to the proportion of such substance(s) are to their total content. Likewise there may be more than one reversible insolubiliser compound. References herein to the proportion of such compound(s) are to their total content.

The aqueous developer composition is dependent on the nature of the polymeric substance. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance is a phenolic resin.

Six simple tests, tests 1 to 6, may be carried out to determine if the composition comprising the active polymer and the reversible insolubiliser compound and a suitable aqueous developer are suitable for use in the present invention.

Test 1

The composition comprising the active polymer in the absence of the reversible insolubiliser compound is coated on a hydrophilic support and dried. Then the surface is inked-up. If a uniform inked coating is obtained then the composition is oleophilic when laid down as a layer.

Test 2

The hydrophilic support coated with the composition comprising the active polymer in the absence of the reversible insolubiliser compound is processed in a suitable aqueous developer for a suitable time which may be determined by trial and error but will typically be between 30 to 60 seconds, at room temperature, and then rinsed, dried and inked-up. If no ink surface is obtained then the composition has dissolved in the developer.

Test 3

The composition comprising the active polymer and the reversible insolubiliser compound is coated on a hydrophilic support, dried and inked-up. If a uniform inked coating is obtained then the composition is oleophilic when laid down as a layer.

Test 4

The hydrophilic support coated with the composition comprising the active polymer and the reversible insolubiliser compound is processed in a suitable aqueous developer for a suitable time which may be determined by trial and error but will typically be between 30 and 60 seconds, at room temperature, and then rinsed, dried and inked-up. If a uniform inked coating is obtained then the composition does not substantially dissolve in the developing solution.

Test 5

The hydrophilic support coated with the composition comprising the active polymer and the reversible insolubiliser compound is heated in an oven such that the composition reaches a suitable temperature for an appropriate time. Then it is processed in a suitable aqueous developer for a reasonable period of time at room temperature.

The surface is then dried and inked-up. If no ink surface is obtained then the heated composition has dissolved in the developer.

The temperature and time depend on the components selected for the composition and on their proportion. Simple trial and error experiments may be undertaken to determine suitable conditions. If such experiments cannot yield conditions which allow the test-to be passed, the conclusion must be that the composition does not pass this test.

Preferably, for typical compositions, the composition comprising the active polymer and the reversible insolubiliser compound is heated in an oven such that the composition reaches a temperature of 50° C. to 160° C. for 5 to 20 seconds. Then it is processed in a suitable aqueous developer for a suitable time which may be determined by trial and error but will typically be 30 to 120 seconds, at room temperature.

Most preferably, the composition comprising the active polymer and the reversible insolubiliser compound is heated in an oven such that the composition reaches a temperature of 50° C. to 120° C. for 10 to 15 seconds. Then it is processed in a suitable aqueous developer for 30 to 90 seconds at room temperature.

Test 6

The hydrophilic support coated with the composition comprising the active polymer and the reversible insolubiliser compound is exposed to U.V. light for a suitable time which may be determined by trial and error but will typically be 30 seconds. Then it is processed in a suitable aqueous developer for a suitable time which may be determined by trial and error but will typically be 30 to 60 seconds at room temperature. The surface is then dried and inked-up. If the coating is inked-up no UV radiation induced solubilisation of the composition has occurred and thus the composition is suitably robust to normal working lighting conditions.

If the composition can pass all six tests then it is suitable for use in the present invention.

A large number of compounds, or combinations thereof, can be utilised as radiation absorbing compounds in preferred embodiments of the present invention.

In preferred embodiments the radiation absorbing compound absorbs infra-red radiation. However, other materials which absorb other wavelength radiation (excluding UV wavelengths), e.g. 488 nm radiation from an Ar-ion laser source, may be used with the radiation being converted to heat.

The radiation absorbing compound is usefully carbon such as carbon black or graphite. It may be a commercially available pigment such as Heliogen Green as supplied by BASF or Nigrosine Base NG1 as supplied by NH Laboratories Inc. or Milori Blue (C.I. Pigment Blue 27) as supplied by Aldrich.

In a preferred method of the invention the coated plate is imagewise exposed directly by a laser. Most preferably the laser emits radiation at above 600 nm and the radiation absorbing compound is usefully an infra-red absorbing dye.

Preferably the infra-red absorbing compound is one whose absorption spectrum is significant at the wavelength output of the laser which is to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Examples of such compounds are:

Thus a preferred weight range for the radiation absorbing compound may be expressed as 2–15% of the total weight of the composition. Likewise there may be more than one radiation absorbing compound. References herein to the proportion of such compound(s) are to their total content.

In one preferred embodiment of the invention an additional layer comprising a radiation absorbing compound can be used. This multiple layer construction can provide routes to high sensitivity as larger quantities of absorber can be used without affecting the function of the imaging forming layer. In principle any radiation absorbing material which absorbs sufficiently strongly in the desired wavelength range can be incorporated or fabricated in a uniform coating. Dyes, metals and pigments (including metal oxides) may be used in the form of vapour deposited layers, techniques for forming and use of such films are well known in the art, for example in EP 0,652,483. The preferred components in the present invention are those that are hydrophilic as the uniform coating or which can be treated to provide a hydrophilic surface, for example by use of a hydrophilic layer.

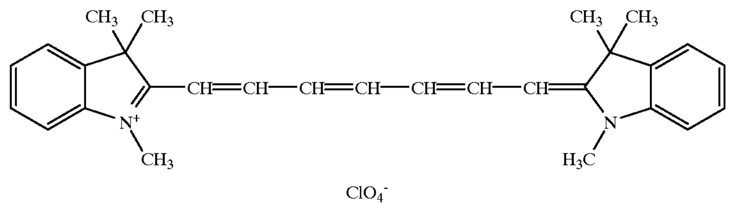

and Dye B

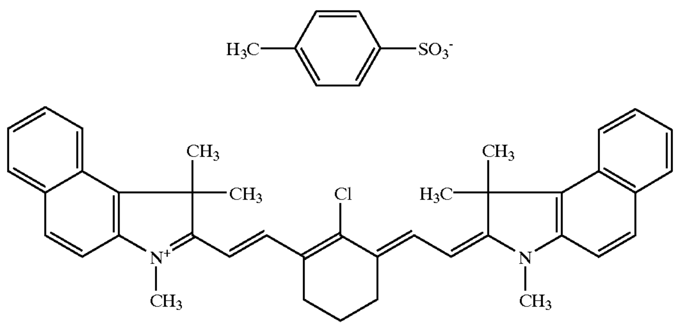

and Dye C, KF654 B PINA as supplied by Riedel de Haen UK, Middlesex, England, believed to have the structure:

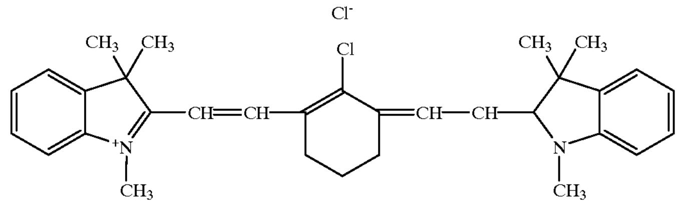

Suitably the radiation absorbing compound constitutes at least 1%, preferably at least 2%, preferably up to 25%, more preferably up to 15%, of the total weight of the composition.

Compounds which reduce the aqueous developer solubility of the polymeric substance and are also radiation absorbing compounds suitable for one embodiment of the present invention are preferably cyanine dyes and most preferably quinolinium cyanine dyes which absorb at above 600 nm.

Examples of such compounds are:

2-[3-chloro-5-(1-ethyl-2(1H)-quinolinylidene)-1,3-pentadienyl]-1-ethylquinolinium bromide

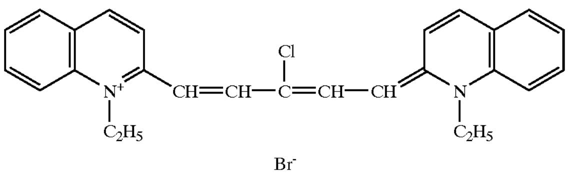

1-Ethyl-2-[5-(1-ethyl-2(1H)-quinolinylidene)-1,3-pentadienyl]quinolinium iodide

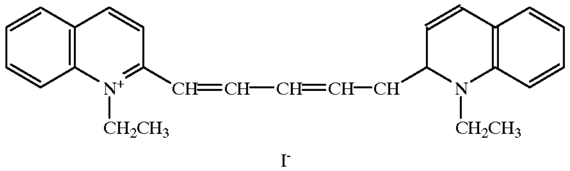

4-[3-chloro-5-(1-ethyl-4(1H)-quinolinylidene)-1,3-pentadienyl]-1-ethylquinolinium iodide

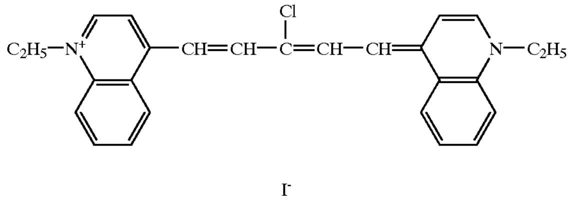

Dye D, 1-Ethyl-4-[5-(1-ethyl-4(1H)-quinolinylidene)-1,3-pentadienyl]quinolinium iodide

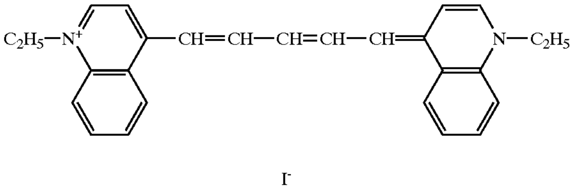

Suitably the reversible insolubiliser compound which is also a radiation absorbing compound constitutes at least 1%, preferably at least 2%, preferably up to 25%, more preferably up to 15%, of the total weight of the composition. Thus a preferred weight range for the reversible insolubiliser compound which is also a radiation absorbing compound may be expressed as 2–15% of the total weight of the composition.

The base which can be used as the support is preferably an aluminium plate which has undergone the usual anodic, graining and post-anodic treatments well known in the lithographic art for enabling a radiation sensitive composition to be coated thereon and for the surface of the support to function as a printing background.

Another base material which may be used in the method of the present invention is a plastics material base or a treated paper base as used in the photographic industry. A particularly useful plastics material base is polyethylene terephthalate which has been subbed to render its surface hydrophilic. Also a so-called resin coated paper which has been corona discharge treated can also be used.

Examples of lasers which can be used in the method of the present invention include semiconductor diode lasers emitting at between 600 nm and 1100 nm. An example is the Nd YAG laser which emits at 1064 nm, but any laser of sufficient imaging power (whose radiation is absorbed by the composition), can be used.

The compositions of the invention may contain other ingredients such as stabilising additives, inert colourants, additional inert polymeric binders as are present in many lithographic plate compositions.

Preferably the heat-sensitive compositions of the present invention do not comprise UV sensitive components. However, UV sensitive components which are not UV activated due to the presence of other components, such as inert UV absorbing dyes or a UV absorbing topmost layer, may be present.

Any feature of any aspect of the present invention or embodiment described herein may be combined with any feature of any other aspect of any invention or embodiment described herein.

The following Examples more particularly serve to illustrate the various aspects of the present invention described hereinabove.

EXAMPLES

The following products are referred to hereinafter:

Resin A: LB6564—a phenol/cresol novolak resin marketed by Bakelite.

Resin B: R17620—a phenol/formaldehyde resole resin marketed by B.P. Chemicals Ltd. of Sully, Wales.

Resin C: SMD995—an alkyl phenol/formaldehyde resole resin marketed by Schnectady Midland Ltd. of Wolverhampton, England.

Resin D: Maruka Lyncur M(S-2)—a poly (hydroxystyrene) resin marketed by Maruzen Petrochemical Co. Ltd. of Tokyo, Japan.

Resin E: Ronacoat 300—a polymer based on dimethylmaleiimide marketed by Rohner Ltd. of Pratteln, Switzerland.

Resin F: Gantrez An119—a methylvinylether-co-maleic anhydride copolymer marketed by Gaf Chemicals Co., Guildford, England.

Resin G: SMA 2625P—a styrene maleic anhydride half ester marketed by Elf Atochem UK Ltd., Newbury, England.

Resin H: Cellulose acetate propionate (Mol. Wt. 75 000, containing 2.5% acetate and 45% to 49% propionate), marketed by Eastman Fine Chemicals, Rochester, USA.

Exposure Test Method

The coated substrate to be imaged was cut into a circle of 105 nm diameter and placed on a disc that could be rotated at a constant speed between 100 and 2500 revolutions per minute. Adjacent to the spinning disc a translating table held the source of the laser beam so that the laser beam impinged normal to the coated substrate, while the translating table moved the laser beam radially in a linear fashion with respect to the spinning disc.

The laser used was a single mode 830 nm wavelength 200 mW laser diode which was focused to a 10 micron resolution. The laser power supply was a stabilised constant current source.

The exposed image was in the form of a spiral whereby the image in the centre of the spiral represented slow laser scanning speed and long exposure time and the outer edge of the spiral represented fast scanning speed and short exposure time. Imaging energies were derived from the measurement of the diameter at which an image was formed.

The minimum energy that can be delivered by this exposure system is 150 mJ/$cm^2$ at an rpm of 2500.

COMPARATIVE EXAMPLES C1 TO C5 AND EXAMPLES 1 TO 9

Coating formulations for all examples were prepared as solutions in 1-methoxypropan-2-ol with the exception of Examples 4, 5 and 8 which were prepared as solutions in 1-methoxypropan-2-ol/DMF 40:60 (v:v) and Example 7 as a solution in 1-methoxy propan-2-ol/DMF 35:65 (v:v). The substrate used was a 0.3 mm sheet of aluminium that had been electrograined and anodised and post-treated with an aqueous solution of an inorganic phosphate. The coating solutions were coated onto the substrate by means of a wire-wound bar. The solution concentrations were selected to provide the specified dry film compositions with a coating weight of 1.3 g per square meter after thorough drying at 100° C. in an oven for 3 minutes.

| | Comparative example | | | | |
|---|---|---|---|---|---|
| | C1 | C2 | C3 | C4 | C5 |
| Component | Parts by Weight | | | | |
| Resin A | 100 | 95.7 | 90 | 90 | 90 |
| Dye B | | 4.25 | 4 | 4 | 4 |
| Benzoic acid | | | 6 | | |
| p-nitrophenol | | | | 6 | |
| 3',3",5',5"-tetrabromophenylphthalein | | | | | 6 |

| | Example | | | | | | | | |
|---|---|---|---|---|---|---|---|---|---|
| | 1 | 2 | 3 | 4 | 5 | 6 | 7 | 8 | 9 |
| Component | Parts by Weight | | | | | | | | |
| Resin A | 86 | 90 | 90 | 90 | 90 | 90 | 90 | 90 | 90 |
| Dye B | 4 | 4 | 4 | 4 | 4 | 4 | 4 | 4 | 4 |
| Dye A | 10 | | | | | | | | |
| 1-ethyl-4-methyl quinolinium bromide | | 6 | | | | | | | |
| Monazoline C | | | 6 | | | | | | |
| Benzothiazolium A | | | | 6 | | | | | |
| Benzothiazolium B | | | | | 6 | | | | |
| Cetyl pyridinium bromide | | | | | | 6 | | | |
| Ethyl viologen dibromide | | | | | | | 6 | | |
| Cetrimide | | | | | | | | 6 | |
| Crystal Violet | | | | | | | | | 6 |

Benzothiazoium A is 3-ethyl-2-[3-ethyl-2(3H)-benzothiazolylidene)-2-methyl-1-propenyl] benzothiazolium bromide.

Benzothiazoium B is 3-ethyl-2-methyl benzothiazolium iodide.

The plates were tested for developability by immersing in an aqueous developer solution for 30 seconds using an appropriate aqueous developer solution as described below.

Developer A: 14% Sodium Metasilicate pentahydrate in water.

Developer B: 7% Sodium Metasilicate pentahydrate in water.

The following table lists results of the simple developability tests for the compositions.

| | Developer B |
|---|---|
| Comparative example 1 to 5 | Coating totally removed |
| Example 1 to 9 | No significant coating removal |

The compositions described in the Comparative examples do not show resistance to developer attack. The compositions described in Examples 1 to 9 illustrate the effect of reducing the polymer developer solubility through the use of compounds described in the present invention.

Further samples of the plates were then imaged using the 830 nm laser device described previously. The exposed discs were then processed by immersing in an aqueous developer solution for 30 seconds using an appropriate aqueous developer solution as described above. Plate sensitivities were then determined.

The results are listed in the following table.

| | Developer A | Developer B |
|---|---|---|
| Comparative example | | |
| 1 | No coating retained | |
| 2 | No coating retained | |
| 3 | No coating retained | |
| 4 | No coating retained | |
| 5 | No coating retained | |
| Example | | |
| 1 | | ≦150 mJ/$cm^2$ |
| 2 | ≦150 mJ/$cm^2$ | |
| 3 | ≦150 mJ/$cm^2$ | |
| 4 | ≦150 mJ/$cm^2$ | |
| 5 | ≦150 mJ/$cm^2$ | |
| 6 | ≦150 mJ/$cm^2$ | |
| 7 | | ≦150 mJ/$cm^2$ |
| 8 | | ≦150 mJ/$cm^2$ |
| 9 | ≦150 mJ/$cm^2$ | |

A printing plate made according to example 1 was also imaged on a commercially available image setter, the Trendsetter, supplied by Creo Products of Vancouver, Canada. The plate printed at least 10,000 good prints on a lithographic printing press.

EXAMPLE 10

A solution containing 8.15 g 1-methoxypropan-2-ol, 2.40 g of a 40% w/w solution Resin A in 1-methoxypropan-2-ol, 0.12 g of Dye A and 0.24 g of a Carbon black dispersion at 50% (w/w) in water was prepared and coated as described in Examples 1 to 9.

| Component | Example 10 Parts by Weight |
|---|---|
| Resin A | 80 |
| Dye A | 10 |
| Carbon Black | 10 |

The resulting plate was imaged using a 200 m W laser diode at a wavelength of 830 nm using the imaging device described previously. The plate was then developed using Developer B for 30 seconds. The imaging energy density required to give a suitable image was ≦150 mJ/cm$^2$.

A printing plate made according to example 10 was also imaged on a commercially available image setter, the Trendsetter, supplied by Creo Products of Vancouver, Canada. The plate printed at least 10,000 good prints on a lithographic printing press.

EXAMPLE 11

The plate precursor with the composition described in the following table was prepared as described for Example 4.

| Component | Example 11 Parts by Weight |
|---|---|
| Resin A | 90 |
| Dye D | 10 |

The resulting plate was imaged using a 200 m W laser diode at a wavelength of 830 nm using the imaging device described previously. The plate was then developed using Developer B for 30 seconds. The imaging energy density required to give a suitable image was ≦150 mJ/cm$^2$.

A printing plate made according to example 11 was also imaged on a commercially available image setter, the Trendsetter, supplied by Creo Products of Vancouver, Canada. The plate printed at least 10,000 good prints on a lithographic printing press.

EXAMPLES 12–18

Coating formulations were prepared as previously described as solutions in 1-methoxy propan-2-ol with the exception of Example 16 which was prepared as a solution in 1-methoxy propan-2-ol/DMF 80:20 (v:v).

The formulations were coated as described in Examples 1–9 to provide dry film compositions as described in the following table.

| | Example | | | | | | |
|---|---|---|---|---|---|---|---|
| | 12 | 13 | 14 | 15 | 16 | 17 | 18 |
| Component | Parts by Weight | | | | | | |
| Crystal Violet | 6 | 6 | 6 | 6 | 6 | 6 | 6 |
| Dye C | 4 | 4 | 4 | 4 | 4 | 4 | 4 |
| Resin A | | 45 | | | | | |
| Resin B | 90 | | | | | | |
| Resin C | | 45 | | | | | |
| Resin D | | | 90 | | | | |
| Resin E | | | | 90 | | | |
| Resin F | | | | | 90 | | |
| Resin G | | | | | | 90 | |
| Resin H | | | | | | | 90 |

Samples of the plates were then imaged using the 830 nm laser device described previously. The exposed discs were then processed by immersing in a suitable aqueous developer solution, as described previously and below, for an appropriate time. Plate sensitivities were then determined. The results are listed in the following table.

Developer C:

15% β-naphthylethoxylate, 5% benzyl alcohol, 2% nitrilo-triacetic acid trisodium salt, 78% water.

Developer D:

3% β-naphthylethoxylate, 1% benzyl alcohol, 2% nitrilo-triacetic acid trisodium salt, 94% water.

Developer E:

1.5% β-naphthylethoxylate, 0.5% benzyl alcohol, 1% nitrilo-triacetic acid trisodium salt, 97% water.

| Example | Developer | Time/seconds | Sensitivity |
|---|---|---|---|
| 12 | B | 90 | 248 mJ/cm$^2$ |
| 13 | A | 90 | 277 mJ/cm$^2$ |
| 14 | C | 45 | 277 mJ/cm$^2$ |
| 15 | D | 5 | 253 mJ/cm$^2$ |
| 16 | E | 60 | 461 mJ/cm$^2$ |
| 17 | D | 90 | 300 mJ/cm$^2$ |
| 18 | A | 120 | 700 mJ/cm$^2$ |

EXAMPLES 19–30

Coating formulations were prepared as previously described as solutions in 1-methoxy propan-2-ol with the exception of example 26 which was prepared as a solution in 1-methoxy propan-2-ol/DMF 50:50 (v:v).

The formulations were coated as described in Examples 1–9 to provide dry film compositions as described in the following table.

| | Example | | | | | | | | | | | |
|---|---|---|---|---|---|---|---|---|---|---|---|---|
| | 19 | 20 | 21 | 22 | 23 | 24 | 25 | 26 | 27 | 28 | 29 | 30 |
| Component | Parts by Weight | | | | | | | | | | | |
| Dye B | 4 | 4 | 4 | 4 | 4 | 4 | 4 | 4 | | | | |
| Dye C | | | | | | | | | 4 | 4 | 4 | 4 |
| Resin A | 90 | 90 | 90 | 90 | 90 | 90 | 90 | 90 | 90 | 90 | 90 | 90 |
| α-Naphthoflavone | 6 | | | | | | | | | | | |
| β-Naphthoflavone | | 6 | | | | | | | | | | |
| Flavone | | | 6 | | | | | | | | | |
| Xanthone | | | | 6 | | | | | | | | |
| Flavanone | | | | | 6 | | | | | | | |
| Benzophenone | | | | | | 6 | | | | | | |

-continued

| Component | Example 19 | 20 | 21 | 22 | 23 | 24 | 25 | 26 | 27 | 28 | 29 | 30 |
|---|---|---|---|---|---|---|---|---|---|---|---|---|
| | Parts by Weight | | | | | | | | | | | |
| 2,3-Dephenyl-1-indeneone | | | | | | | 6 | | | | | |
| N-(4-bromobutyl) phthalimide | | | | | | | | 6 | | | | |
| Phenanthrene quinone | | | | | | | | | 6 | | | |
| Acridine Orange Base (CI solvent orange 15) | | | | | | | | | | 6 | | |
| p-Toluene sulfonyl chloride | | | | | | | | | | | 6 | |
| Ethyl-p-toluene sulfonate | | | | | | | | | | | | 6 |

Samples of the plates were then imaged using the 830 nm laser device described previously. The exposed discs were then processed by immersing in a suitable aqueous developer solution, for an appropriate time. Plate sensitivities were then determined. The results are listed in the following table.

| Example | Developer | Time/seconds | Sensitivity |
|---|---|---|---|
| 19 | A | 30 | ≦150 mJ/cm$^2$ |
| 20 | A | 30 | ≦150 mJ/cm$^2$ |
| 21 | A | 30 | 290 mJ/cm$^2$ |
| 22 | A | 30 | ≦150 mJ/cm$^2$ |
| 23 | A | 30 | ≦150 mJ/cm$^2$ |
| 24 | B | 30 | 220 mJ/cm$^2$ |
| 25 | B | 30 | ≦150 mJ/cm$^2$ |
| 26 | B | 15 | ≦150 mJ/cm$^2$ |
| 27 | B | 60 | 250 mJ/cm$^2$ |
| 28 | A | 90 | 250 mJ/cm$^2$ |
| 29 | B | 10 | 400 mJ/cm$^2$ |
| 30 | B | 60 | 250 mJ/cm$^2$ |

EXAMPLE 31

The coating formulation was prepared as previously described as a solution in 1-methoxy propan-2-ol. The formulation was coated as described in examples 1–9 to provide a dry film composition as described in the following table.

| Component | Example 31 Parts by Weight |
|---|---|
| Resin A | 90 |
| Dye C | 4 |
| Crystal Violet | 6 |

Samples of the plate were subjected to heat delivered from a Weller Soldering Iron EC 2100 M at 311° C. The speed of movement of the soldering iron over the plate surface is described in the table below. The exposed plate samples were then processed by immersion in developer A for 60 seconds. The results are listed in the table below.

| Speed of Soldering Iron Movement over Plate Surface/cm $s^{-1}$ | Heat applied to . . . | Simple Developability Test Result |
|---|---|---|
| 1 | coated face of plate | Coating totally removed in area subjected to heat |
| 10 | coated face of plate | Coating totally removed in area subjected to heat |
| 20 | coated face of plate | Coating totally removed in area subjected to heat |
| 50 | coated face of plate | Coating totally removed in area subjected to heat |
| 1 | reverse face of plate, i.e. direct on the aluminium support | Coating totally removed in area subjected to heat |
| 10 | reverse face of plate, i.e. direct on the aluminium support | Coating totally removed in area subjected to heat |

In the specification, we refer in various places to UV light. A person skilled in the art will be aware of the typical wavelength range of UV light. However, for the avoidance of any doubt, UV typically has a wavelength range of 190 nm to 400 nm.

All of the features disclosed in this specification (including any accompanying claims, abstract and drawings), and/or all of the steps of any method or process disclosed, may be combined in any combination, except combinations where at least some of such features and/or steps are mutually exclusive.

Each feature disclosed in this specification (including any accompanying claims, abstract and drawings), may be replaced by alternative features serving the same, or equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A method of producing a lithographic printing form, the method comprising:

(A) imagewise applying heat to a positive-working lithographic printing form precursor comprising a coating, the coating comprising a positive-working, oleophilic, heat sensitive composition coated on a support having a hydrophilic surface, the coated composition comprising:

an aqueous alkaline developer soluble polymeric substance; and a compound which reduces the aqueous alkaline developer solubility of the polymeric substance;

wherein (i) the composition when coated onto the hydrophilic substrate and processed in an aqueous alkaline developer does not substantially dissolve in the aqueous alkaline developer;

(ii) the aqueous alkaline developer solubility of the composition is increased by heating; and (iii) the aqueous alkaline developer solubility of the composition is not increased by incident ultraviolet radiation; and (B) applying the aqueous alkaline developer to the precursor, wherein portions of the coated composition where the heat was applied are dissolved.

2. The method as claimed in claim 1 wherein the heat is delivered from a laser.

3. The method as claimed in claim 2 wherein the laser emits radiation above 600 nm.

4. The method as claimed in claim 1 wherein the heat is delivered from a heated body.

5. An imaged printing form produced by the method of claim 1.

6. The method as claimed in claim 1 wherein the aqueous alkaline developer soluble polymeric substance comprises a functional group or groups selected from the group consisting of hydroxy, carboxylic acid, amino, amide and maleiimide.

7. The method as claimed in claim 1 wherein the aqueous alkaline developer soluble polymeric substance is a polymer or copolymer of hydroxystyrene, a copolymer of acrylic acid, a copolymer of methacrylic acid, a polymer or copolymer of maleiimide, a polymer or copolymer of maleic anhydride, a hydroxycellulose, a carboxy cellulose or a phenolic resin.

8. The method as claimed in claim 1 wherein the aqueous alkaline developer soluble polymeric substance is a phenolic resin.

9. The method as claimed in claim 1 wherein the compound which reduces the aqueous alkaline solubility of the polymeric substance is a compound which comprises at least one nitrogen atom which is quarternized.

10. The method as claimed in claim 1 wherein the compound which reduces the aqueous alkaline developer solubility of the polymeric substance is a compound which comprises at least one nitrogen atom incorporated into a heterocyclic ring.

11. The method as claimed in claim 1 wherein the compound which reduces the aqueous alkaline developer solubility of the polymeric substance is a quinoline or a triazole.

12. The method as claimed in claim 1 wherein the compound which reduces the aqueous alkaline developer solubility of the polymeric substance is a compound that comprises at least one quarternized nitrogen atom incorporated in a heterocyclic ring.

13. The method as claimed in claim 12 wherein the compound which reduces the aqueous alkaline developer solubility of the polymeric substance is an imidazoline compound, a quinolinium compound, a benzothiazolium compound or a pyrindinium compound.

14. The method as claimed in claim 13 wherein the compound that reduces the aqueous developer solubility of the polymeric substance is a quinolinium compound and the quinolinium compound is a cyanine dye.

15. The method as claimed in claim 13 wherein the compound that reduces the aqueous developer solubility of the polymeric substance is a bensothiazolium compound and the benzothiazolium compound is a cyanine dye.

16. The method as claimed in claim 1 wherein the compound which reduces the aqueous alkaline developer solubility of the polymeric substance is a triarylmethane compound.

17. The method as claimed in claim 1 wherein the compound which reduces the aqueous alkaline developer solubility of the polymeric substance is a compound which comprises a carbonyl functional group.

18. The method as claimed in claim 17 wherein the compound which reduces the aqueous alkaline developer solubility of the polymeric substance is selected from the group consisting of flavone, xanthone, benzophenone, N-(4-bromobutyl)phthalimimde, 2,3-diphenyl-1-indeneone and phenthrenequinone.

19. The method as claimed in claim 1 wherein the compound which reduces the aqueous alkaline developer solubility of the polymeric substance is a flavone compound.

20. The method as claimed in claim 1 wherein the compound which reduces the aqueous alkaline developer solubility of the polymeric substance is a compound of the general formula:

$$Q_1\text{-}S(O)_n\text{-}Q_2$$

wherein $Q_1$ is a substituted or unsubstituted phenyl or alkyl group, n is 0, 1 or 2, and $Q_2$ is a halogen atom or alkoxy group.

21. The method as claimed in claim 1 wherein the compound which reduces the aqueous alkaline developer solubility of the polymeric substance is selected from the group consisting of ethyl-p-toluene sulfonate and p-toluene sulfonyl chloride.

22. The method as claimed in claim 1 wherein the compound which reduces the aqueous alkaline developer solubility of the polymeric substance is acridine orange base.

23. The method as claimed as claim 1 wherein the compound which reduces the aqueous alkaline developer solubility of the polymeric substance is a ferrocenium compound.

24. The method as claimed in claim 1 wherein said coating is adapted to absorb radiation and convert said radiation to said heat.

25. The method as claimed in claim 24 wherein said coating composition comprises a radiation absorbing compound capable of absorbing incident radiation and converting it to heat.

26. The method as claimed in claim 25 wherein the radiation absorbing compound is carbon black.

27. The method as claimed in claim 25 wherein the radiation absorbing compound is a pigment.

28. The method as claimed in claim 27 wherein the pigment is an organic pigment.

29. The method as claimed in claim 27 wherein the pigment is a phthalocyanine pigment.

30. The method as claimed in claim 27 wherein pigment is an inorganic pigment.

31. The method as claimed in claim 27 wherein pigment is selected from the group consisting of Prussian Blue, Heliogen Green and Nigrosine.

32. The method as claimed in claim 25 wherein the radiation absorbing compound is a dye selected from the group consisting of squarylium dyes, merocyanine dyes, cyanine dyes, indolizine dyes, pyrylium dyes and metal dithioline dyes.

33. The method as claimed in claim 25 wherein the radiation absorbing compound absorbs at above 600 mn.

34. The method as claimed in claim 24 wherein the compound which reduces the aqueous alkaline developer solubility of the polymeric substance is also a radiation absorbing compound capable of absorbing incident radiation and converting it to heat.

35. The method as claimed in claim 34 wherein the compound which reduces the aqueous developer solubility of the polymeric substance and is also a radiation absorbing compound is a cyanine dye which comprises a quinolinium moiety.

36. The method as claimed in claim 24 wherein said coating comprises an additional layer disposed beneath the coated composition, wherein the additional layer comprises a radiation absorbing compound capable of absorbing incident radiation and converting it to heat.

37. The method as claimed in claim 36 wherein the additional layer is a thin layer of dye or pigment.

38. The method as claimed in claim 36 wherein the additional layer is a thin layer of metal or metal oxide.

39. The method as claimed in claim 36 wherein the radiation absorbing compound is carbon black.

40. The method as claimed in claim 36 wherein the radiation absorbing compound is a pigment.

41. The method as claimed in claim 40 wherein the pigment is an organic pigment.

42. The method as claimed in claim 40 wherein the pigment is a phthalocyanine pigment.

43. The method as claimed in claim 40 wherein pigment is an inorganic pigment.

44. The method as claimed in claim 40 wherein pigment is selected from the group consisting of Prussian Blue, Heliogen Green and Nigrosine.

45. The method as claimed in claim 36 wherein the radiation absorbing compound is a dye selected from the group consisting of squarylium dyes, merocyanine dyes, cyanine dyes, indolizine dyes, pyrylium dyes and metal dithioline dyes.

46. The method as claimed in claim 36 wherein the radiation absorbing compound absorbs at above 600 nm.

47. The method as claimed in claim 36 wherein both the composition and the additional layer each comprises a radiation absorbing compound capable of absorbing incident radiation and converting it to heat.

48. The method as claimed in claim 1 wherein the coated composition is on the support.

49. The method as claimed in claim 48 wherein the aqueous alkaline developer soluble polymeric substance is a phenolic resin.

50. The method as claimed in claim 49 wherein the phenolic resin is a novolak resin.

51. The method as claimed in claim 50 wherein the compound which reduces the aqueous alkaline developer solubility of the polymeric substance is a compound which comprises at least one nitrogen atom which is quarternized.

52. The method as claimed in claim 51 wherein the compound which comprises at least one nitrogen atom which is quarternized is a heterocylic compound.

53. The method as claimed in claim 51 wherein the compound which comprises at least one nitrogen atom which is quarternized is a tetralkyl ammonium compound.

54. The method as claimed in claim 50 wherein the compound which reduces the aqueous alkalilne developer solubility of the polymeric substance is a triarylmethane dye.

55. The method as claimed in claim 54 wherein the triarylmethane dye is Crystal Violet or Ethyl Violet.

56. An imaged printing form produced by the method of claim 54.

57. The method as claimed in claim 50 wherein the compound which reduces the aqueous alkaline developer solubility of the polymeric substance is an imidazoline compound, a quinolinium compound, a benzothiazolium compound or a pyridinium compound.

58. The method as claimed in claim 50 wherein the compound which reduces the aqueous alkaline developer solubility of the polymeric substance is a cyanine dye.

59. The method as claimed in claim 50 wherein the novolak resin comprises at least 80% of the total weight of the composition.

60. The method as claimed in claim 59 wherein the compound which reduces the aqueous alkaline developer solubility of the polymeric substance is a dye selected from the group consisting of triarylmethane dyes, squarylium dyes, merocyanine dyes, cyanine dyes, indolizine dyes, pyrlium dyes, and metal dithioline dyes

61. The method as claimed in claim 50 wherein said composition additionally comprises a radiation absorbing compound capable of absorbing incident radiation and converting it to heat.

62. The method as claimed in claim 61 wherein the novolak resin comprises at least 80% of the total weight of the composition, the compound which reduces the aqueous alkaline developer solubility of the polymeric substance comprises 1–15% of the total weight of the composition, and the radiation absorbing compound comprises 1–15% of the total weight of the composition.

63. An imaged printing form produced by the method of claim 62.

64. An imaged printing form produced by the method of claim 50.

* * * * *

UNITED STATES PATENT AND TRADEMARK OFFICE
CERTIFICATE OF CORRECTION

PATENT NO. : 6,485,890 B2
DATED : November 26, 2002
INVENTOR(S) : Parsons et al.

It is certified that error appears in the above-identified patent and that said Letters Patent is hereby corrected as shown below:

Column 20,
Line 5, delete "pyrindinium" and insert therefore -- pyridinium --;
Line 12, delete "bensothiazolium" and insert therefore -- benzothiazolium --;
Line 26, delete "phthalimimde" and insert therefore phthalimide --;
Line 27, delete "phenthrenequinone" and insert therefore -- phenanthrenequinone --;
Line 49, delete "as" and insert therefore -- in --;

Column 21,
Line 12, delete "mn" and insert therefore -- nm --;

Column 22,
Line 15, delete "tetralkyl" and insert therefore -- tetraalkyl --
Line 17, delete "alkalilne" and insert therefore -- alkaline --.

Signed and Sealed this

Sixth Day of May, 2003

JAMES E. ROGAN
*Director of the United States Patent and Trademark Office*